United States Patent
Tsui

(10) Patent No.: US 6,489,204 B1
(45) Date of Patent: Dec. 3, 2002

(54) SAVE MOS DEVICE

(75) Inventor: Bing-Yue Tsui, Hsinchu (TW)

(73) Assignee: Episil Technologies, Inc., Hsin-chu (TW)

( * ) Notice: Subject to any disclaimer, the term of this patent is extended or adjusted under 35 U.S.C. 154(b) by 0 days.

(21) Appl. No.: 09/932,727

(22) Filed: Aug. 20, 2001

(51) Int. Cl.⁷ .......................................... H01L 21/336
(52) U.S. Cl. ...................... 438/270; 438/206; 438/212; 438/242; 257/302; 257/329
(58) Field of Search .................. 438/206, 212, 438/242, 270, 271, 272, 243; 257/302, 329

(56) References Cited

U.S. PATENT DOCUMENTS

| | | | |
|---|---|---|---|
| 5,714,781 A | 2/1998 | Yamamoto et al. | 257/329 |
| 5,897,343 A | 4/1999 | Mathew et al. | 438/133 |
| 5,915,180 A | 6/1999 | Hara et al. | 438/270 |
| 6,015,737 A | 1/2000 | Tokura et al. | 438/270 |
| 6,051,468 A * | 4/2000 | Hshieh | 257/330 |
| 6,080,627 A * | 6/2000 | Fan et al. | 438/270 |
| 6,096,608 A | 8/2000 | Williams | 438/270 |
| 6,137,135 A | 10/2000 | Kubo et al. | 257/328 |
| 6,211,018 B1 * | 4/2001 | Nam et al. | 438/135 |
| 6,274,437 B1 * | 8/2001 | Evans | 257/330 |

OTHER PUBLICATIONS

D. Ueda et al., "An Ultra–Low On–Resistance Power MOSFET Fabricated by Using a Fully Self–Aligned Process," IEEE Trans, El. Dev., vol. ED–34, No. 4, Apr. 1987, pp. 926–930.

T. Syan et al., "Comparison of Ultralow Specific On–Resistance UMOSFET Structures: The ACCUFET, EXTFET, INVFET, and Conventional UMOSFETS's," IEEE Trans. El. Dev., vol. ED–41, No. 5, May 1994, pp. 800–808.

B.J. Baliga, "Trends in Power Discrete Devices," Proc. 1998 Intl. Symp. on Power Semiconductor Devices and Ics, pp. 2–10.

J. Kim et al., "High–Density Low On–Resistance Trench MOSFETs Employing Oxide Spacers and Self–Align Technique for DC/DC Converter," ISPSD'2000, May 22–25, Toulouse, France, pp. 381–384.

* cited by examiner

*Primary Examiner*—Carl Whitehead, Jr.
*Assistant Examiner*—Jeff Vockrodt
(74) *Attorney, Agent, or Firm*—George O. Saile; Stephen B. Ackerman

(57) ABSTRACT

Using current technology, the only way to further increase device density is to decrease device pitch. The present invention achieves this by introducing a sidewall doping process that effectively reduces the source width, and hence the pitch. This sidewall doping process also eliminates the need for a source implantation mask while the sidewall spacer facilitates silicide formation at the source, the P body contact, and the polysilicon gate simultaneously. Since the source and P body are fully covered by silicide, the contact number and contact resistance can be minimized. The silicided polysilicon gate has a low sheet resistance of about 4–6 ohm/square, resulting in a higher operating frequency.

18 Claims, 5 Drawing Sheets

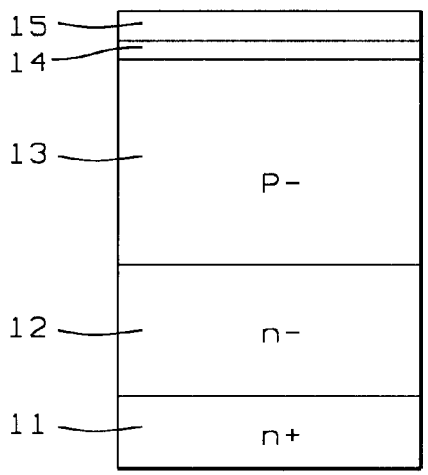
FIG. 1a – Prior Art
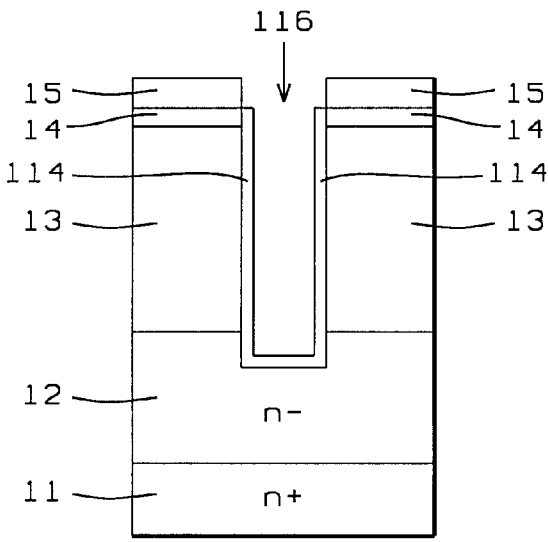
FIG. 1b – Prior Art
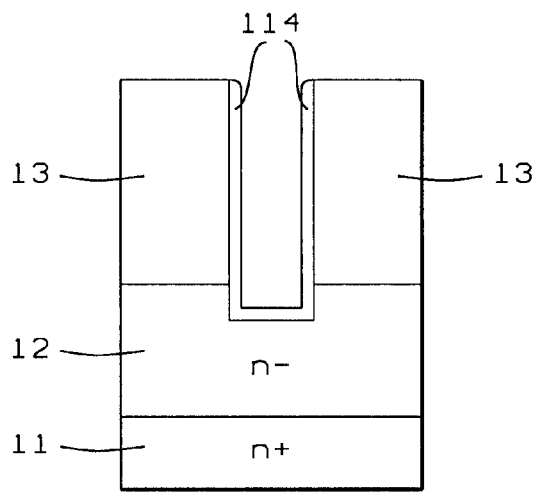
FIG. 1c – Prior Art

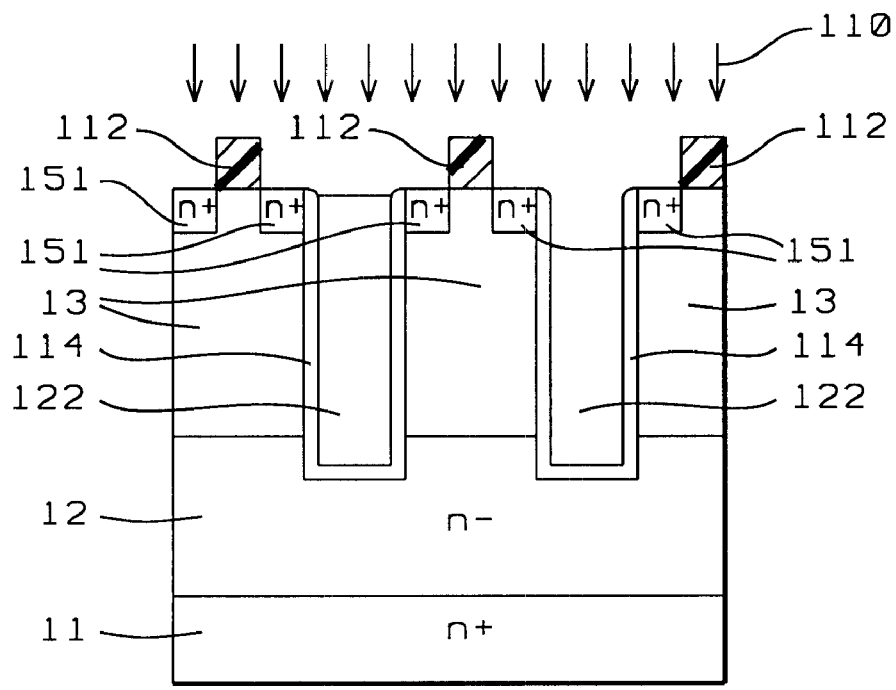
FIG. 1d – Prior Art
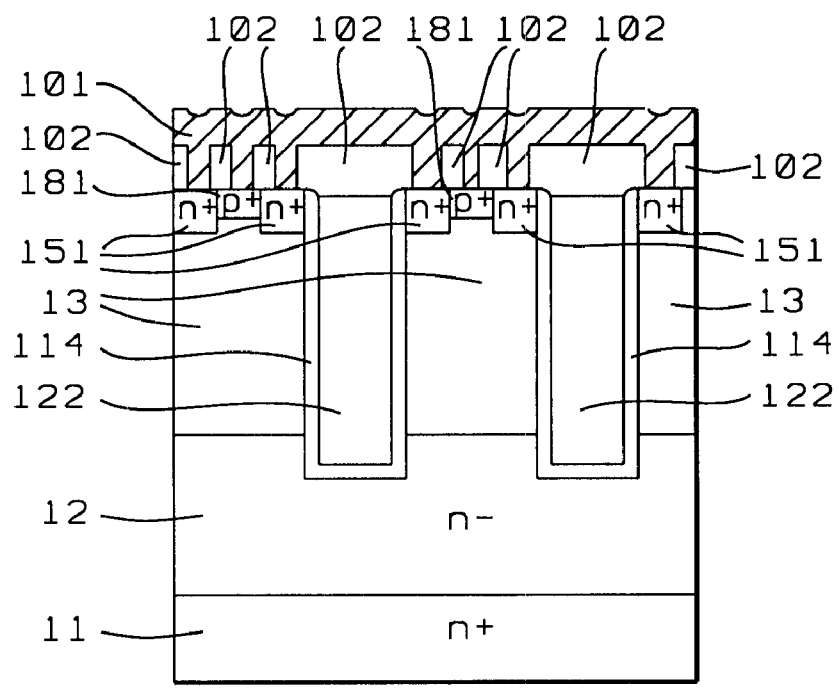
FIG. 1e – Prior Art

SAVE MOS DEVICE

FIELD OF THE INVENTION

The invention relates to the general field of high power field effect transistors.

BACKGROUND OF THE INVENTION

Power MOSFETs have been widely applied to a variety of power electronics systems because of their inherent advantages such as high speed, low on-resistance, and excellent thermal stability. One of the most efficient methods to reduce on-resistance is to increase the packing density and the vertical (trench gate) MOSFET has been acknowledged to be the best device structure for achieving this.

A conventional device structure and the process flow for its manufacture are shown in FIG. 1. Starting with FIG. 1a, after P body 13 is diffused into an N+ N− epitaxial wafer 11 and 12, thin $SiO_2$ and $Si_3N_4$ films 14 and 15 respectively, are grown over the wafer. Rectangular trenches 116 are then formed by using RIE (reactive ion etching) followed by oxidation to form gate layer 114 (FIG. 1b). In-situ doped poly-Si 122 is then deposited to refill the trenches. After polysilicon etch back, the $Si_3N_4$ and $SiO_2$ films are removed, as shown in FIG. 1c). Photolithography is then used to define the N+ source region 151 by means of photoresist maks 112, followed by the N+ source implantation 110 (FIG.1d).

Another photolithography step is used to form P body contact region 181. Finally, contact holes formation, through passivation layer 102, and Al-metalization (layer 101) are performed to complete device fabrication (FIG. 1e).

The only way to further increase device density is to decrease device pitch. For the conventional process described in FIGS. 1a–1e, the pitch is determined by the trench width, the N+ source width, and the P body contact width. Thus the pitch limit is set by the lithography technology. To reduce pitch still further implies a reduction of the design rules and this is a high cost approach.

Kim (see reference below) has proposed a self-aligned technique to reduce device pitch in which an oxide spacer is used as a hard mask to etch a trench. Because of the rounded corner of such as spacer, the trench profile is tapered so that the device pitch still exceeds 2 microns. The maximum device density is 110 Mcell/in$^2$. Furthermore, the N+ region at the bottom of the trench will degrade the quality of gate oxide and result in a locally stronger electric field. Another drawback is the small contact area to the source.

The present invention discloses a fully self-aligned trench gate MOSFET technique which uses self-aligned source and drain contacts and also saves one photolithography step in the process. With this technique the device density can be greatly increased by altering photolithography process. An additional benefit of the technique is a lower gate resistance owing to silicidation at the gate.

A routine search of the prior art was performed with the following references of interest being found:

PUBLICATIONS

D. Ueda et al. "An ultra-low on-resistance power MOSFET fabricated by using a fully self-aligned process" IEEE Trans. El. Dev. vol. ED-34 no. 4, April 1987 pp. 926–930.

T. Syau et al. "Comparison of ultra-low specific on-resistance UMOSFET structures: The ACCUFET, EXTFET, INVFET, and conventional UMOSFETs" IEEE Trans. El. Dev. vol. ED41 no. 5, May 1994 pp. 800–808.

B. J. Baliga "Trends in power discrete devices" Proc. 1998 Intl. Symp. on power semiconductor devices and Ics" pp. 2–10.

J. Kim et al. "High-density low on-resistance trench MOSFETs employing oxide spacers and self-align technique for DC/DC Converter" ISPSD'May 22–25, 2000 Toulouse, France, pp. 381–384.

Patents

U.S. Pat. No. 5,915,180 (Hara et al.) shows a vertical trench gate power MOSFET. U.S. Pat. No. 6,015,737 (Tokura et al.), U.S. Pat. No. 6,096,608 (Williams), U.S. 5,714,781 (Yamamoto et al., and U.S. Pat. No. 5,897,343 (Mathew et al.) all show other vertical power MOSFETs. In U.S. Pat. No. 6,137,135, Kubo et al. disclose a vertical trench MOSFET.

SUMMARY OF THE INVENTION

It has been an object of at least one embodiment of the present invention to provide a process for manufacturing a vertical power MOSFET.

Another object of at least one embodiment of the present invention has been that said process result in an MOSFET that has, relative to the prior art, higher cell density, higher speed, easy scalability, and wide application.

A further object of at least one embodiment of the present invention has been that said process be fully compatible with existing processes used for the manufacture of vertical power MOSFETs.

These objects have been achieved by means of a sidewall doping process that effectively reduces the source width, and hence the device pitch. This sidewall doping process also eliminates the need for a source implantation mask while the sidewall spacer facilitates silicide formation at the source, the P body contact, and the polysilicon gate simultaneously. Since the source and P body are fully covered by silicide, the contact number and contact resistance can be minimized. The silicided polysilicon gate has a low sheet resistance of about 4–6 ohm/square, resulting in a higher operating frequency.

BRIEF DESCRIPTION OF THE DRAWINGS

FIGS. 1a–1e illustrate the prior art process for forming a vertical MOSFET.

DESCRIPTION OF THE PREFERRED EMBODIMENTS

The present invention provides an improved process for manufacturing a vertical power MOSFET. Although additional variations of our process could be introduced, it can be viewed as being divided into two general embodiments:

1st Embodiment

Figure 2A:
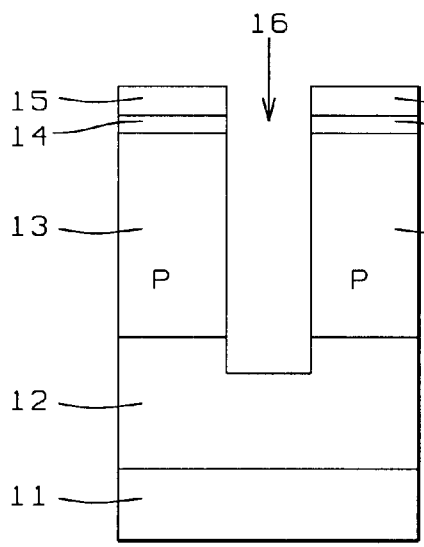
FIG. 2a shows trench formation in a three layer silicon wafer.

Referring now to FIG. 2a, the process begins with the provision of a silicon wafer having an N+ bottom layer 11 and an N− type middle layer 12 in a P body 13. A layer of pad oxide 14 is then formed on the top surface, followed by of silicon nitride layer 15. These layers are patterned so that they serve as a mask for the formation of trench 16 whose depth is sufficient for it to extend into middle layer 13. As alternative option, these two layers may be replaced by a single layer of silicon oxide having a thickness between about 0.2 and 1 microns.

Figure 2B:
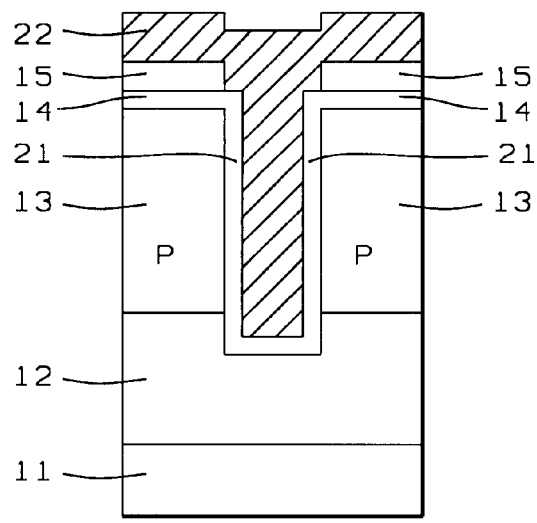
FIG. 2b shows the trench after over-filling with polysilicon.
Figure 3:
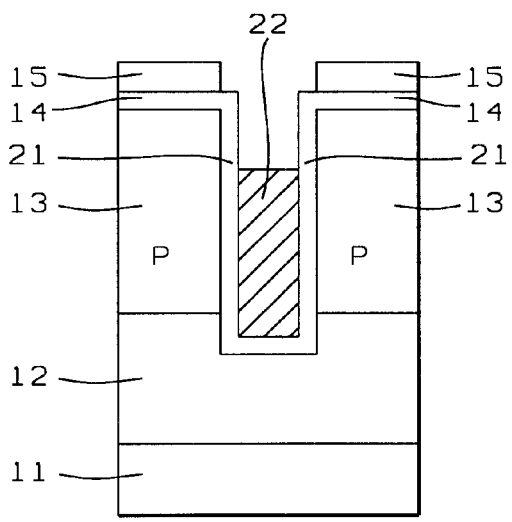
FIG. 3 shows part of said polysilicon removed.

Next, silicon oxide layer 21 is formed on the floor and sidewalls of trench 16, as shown in FIG. 2b. The trench is then overfilled with polysilicon 22, following which this polysilicon is etched back so that it now under-fills the trench, as shown in FIG. 3. As an alternative to etching back the excess polysilicon, the excess polysilicon may be planarized until there is no polysilicon outside the trench and then some polysilicon in the trench can be removed by means of reactive ion etching or chemical etching in a $HF/HNO_3$ solution.

Figure 4A:
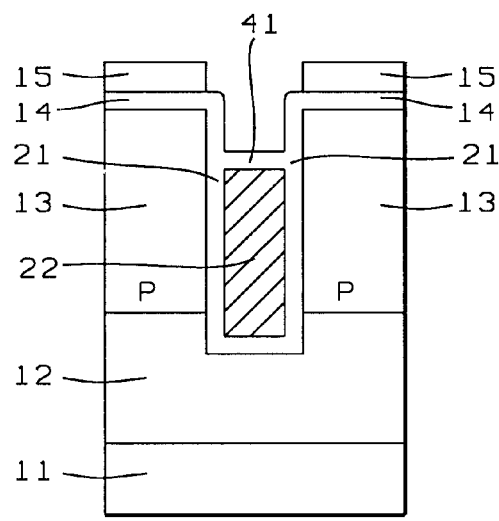
FIG. 4a shows the polysilicon fully encapsulated in oxide (first embodiment).

All exposed silicon oxide is then removed from the trench's sidewalls and thin silicon oxide layer 41 is grown on the top surface of polysilicon 22 as well as the exposed silicon sidewalls so that the latter becomes encapsulated in silicon oxide, as shown in FIG. 4a.

Figure 5A:
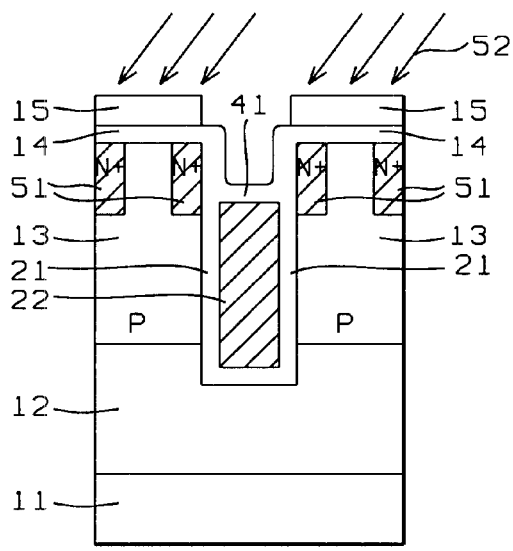
FIG. 5a shows how the source region is formed through ion implantation at an angle.
Figure 6:
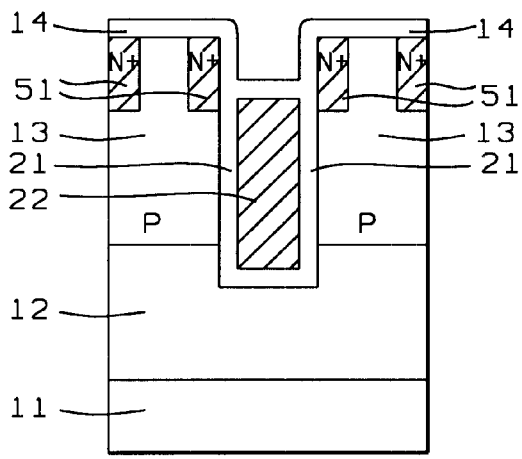
FIG. 6 shows the structure at the completion of source formation.

Referring next to FIG. 5a, as a key feature of the process N+ source area 51 is formed through ion implantation of donor ions (such as arsenic) by ion beam 52. Typically, the arsenic ions have an energy between about 30 and 80 kilovolts, and are deposited so as to achieve a final concentration between about $5 \times 10^{19}$ and $5 \times 10^{20}$ ions per cc. The ion beam is directed at an angle that is between about 30 and 60 degrees from the vertical and at the same time the wafer is rotated. As can be seen in FIG. 5a, the right outer part and the left inner part of 51 are being formed at any given time. In particular, polysilicon plug 22 acts as a mask to ensure that ions penetrate the uncovered sidewalls of the trench as well as a small amount of the trench wall that overlaps with the polysilicon. In other words, the process is self-aligning. Silicon nitride mask 15 is removed at the completion of the ion implantation step. This is illustrated in FIG. 6.

Figure 7:
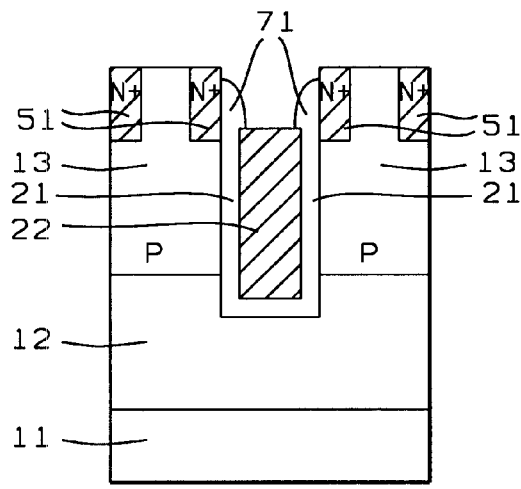
FIG. 7 shows the formation of insulating spacers on the trench wall.

As seen in FIG. 7, the next step is the formation of spacers 71 to protect the exposed portions of the trench's sidewalls. This is accomplished by depositing a conformal layer of a dielectric material (silicon oxide or silicon nitride) and then selectively removing it from horizontal surfaces only. Depending on the thickness given to the conformal dielectric coating and the etching time, the insulating spacers extend upwards from the polysilicon as far the upper surface of the wafer or they may extend only as far as a line that is between about 0.1 and 0.3 microns below the upper surface of the wafer.

Figure 8:
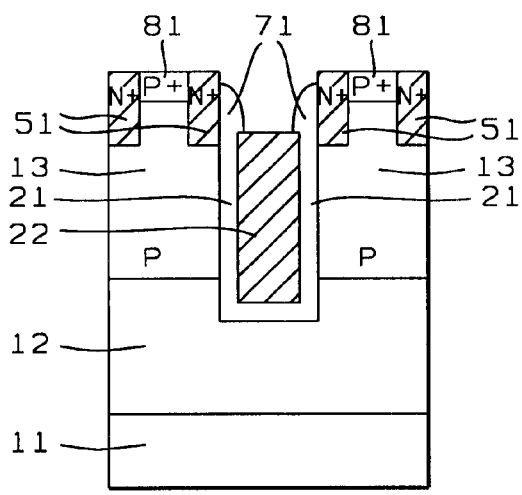
FIG. 8 shows formation of the contact to the main P+ body of the device.

This is followed by formation of contact area 81 to P body 13 by implanting acceptor ions (such as boron or $BF_3^+$), to a concentration that is lower than that of the N+ source region so no mask is required, into the space between the two parts of source contact 51, as shown in FIG. 8.

Figure 9:
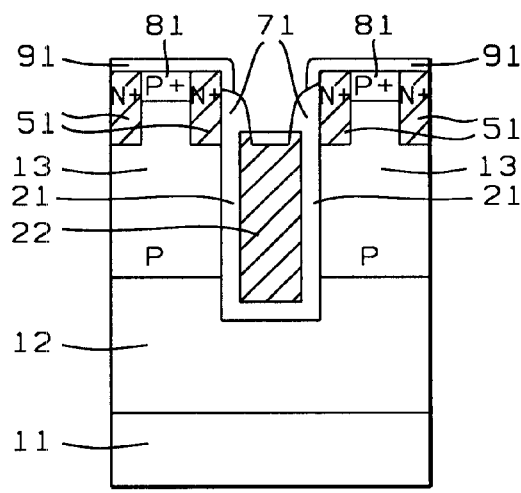
FIG. 9 shows the completed device including silicide contacts.

The final step, as illustrated in FIG. 9, is the formation of silicide contacts 91 using the conventional SALICIDE (self-aligned silicide) process. A single contact to 51 and 81 is automatically achieved. Contact to the drain is made through bottom layer 11 which can be mounted on a heat sink. The silicide contacts may be titanium silicide, cobalt silicide, or nickel silicide.

This completes the process of the first embodiment. We note here that source to source spacing in the device could be further reduced by adding a punch through implantation after the spacers have been formed. This would involve additional P type implantation ($B^+$ or $BF_3^+$ ions) to increase the surface concentration between the two adjacent N+ sources.

2nd Embodiment

Figure 4B:
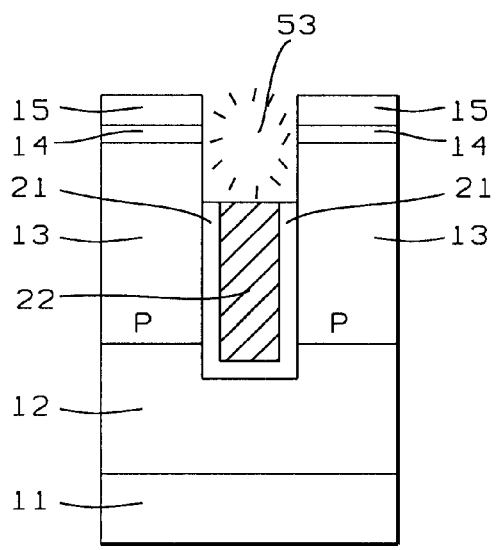
FIG. 4b shows the polysilicon with an oxide free top surface (second embodiment).
Figure 5B:
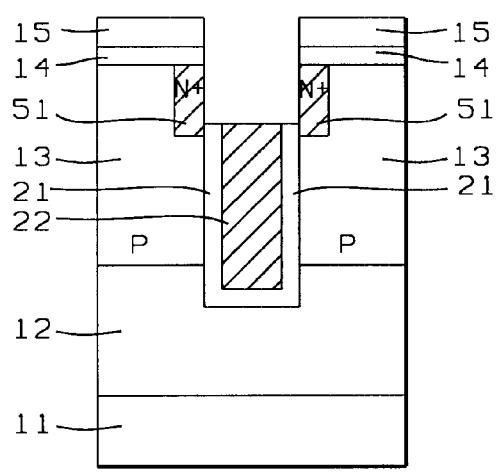
FIG. 5b shows how the source region is formed through diffusion.

The second embodiment resembles the first embodiment for all process steps except the key one of how the N+ source contacts 51 are formed. Instead of ion implantation, diffusion is used. To prepare the structure for this, as shown in FIG. 4b, layer 41 is not laid down (as was the case shown in FIG. 4a for the first embodiment). Thus, in FIG. 5, instead of an ion beam as shown there, a gas phase diffusion source 53 is provided for forming the N+ source area 51. After diffusion inwards through the sidewalls of the trench, 51 can be seen to extend away from the wall into the top P body 13 and to extend downwards as far as the edge of polysilicon plug 22, again resulting in self-alignment.

Figure 5C:
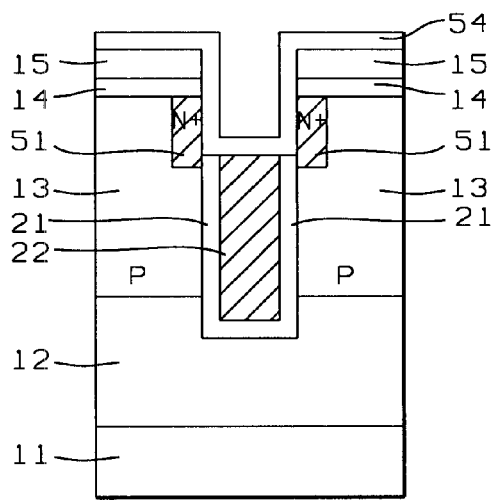
FIG. 5c shows how the source region is formed using doped polysilicon as a diffusion source.

Three different ways of incorporating a diffusion step as part of the process of the present invention are disclosed:

(1) The diffusion source is phosphorus oxychloride gas.
(2) The diffusion source is a layer of a glass such as phosphosilicate glass or arsenosilicate glass which is removed at the conclusion of the diffusion.
(3) The diffusion source is doped polysilicon. In this case, the trench is filled to the brim with thin N+ polysilicon layer 54 (about 500 Angstroms thick), as shown in FIG. 5c, which then serves as the diffusion source. After diffusion, layer 54 is fully oxidized so that source 51 and polysilicon plug 22 just line up.

At the conclusion of the diffusion step described above silicon nitride is removed and the process of the second embodiment reverts to that of the first embodiment (see FIG. 6.

The two embodiments described above offer the following advantages over processes currently being used to manufacture vertical MOS power devices:

(i) High Cell Density (a) Trench to trench distance is determined only by 2×W(N+)+W(P+). Assuming W(N+)=0.3 μm, W(P+)=0.4 μm, Wt=0.5 μm (where Wt is trench width), then cell pitch=1.5 μm, corresponding to a cell density of 286 MCPSI (million cells per sq. inch) using 0.5 μm technology (b) N+ source and P+ body contact are connected by silicide (91) so a butted contact forms automatically.

(c) Since the polysilicon gate is silicided, gate contact number (number of contact holes connecting metal to gate) can be minimized.

(ii) High Speed (a) Since the source is silicided the source resistance is minimized.

(b) Since the gate is silicided the gate resistance is minimized, thereby minimizing gate RC delay.

(c) Since the N+ source and P body are connected by silicide metal can contact them through a contact hole without sacrificing cell density.

(d) Gate-source capacitance is also minimized because source implantation is self-aligned to the gate edge.

(iii) Easy to Scale Down

Only Wt depends on patterning technology. W(N+) can be scaled down by reducing implantation energy or thermal budget.

W(P+) can be scaled down by increasing P body concentration or by adding a punch through implantation, as discussed earlier.

(iv) Fewer masks

N+ source can be formed without a mask.

(v) Wide Application

This technology can be adapted to other devices that have a trenched gate structure as IGBT (insulated gate bipolar transistor) and all types of UMOSFET (where 'U' refers to the shape of the trench), While the invention has been particularly shown and described with reference to the preferred embodiments thereof, it will be understood by those skilled in the art that various changes in form and details may be made without departing from the spirit and scope of the invention.

What is claimed is:

1. A process for manufacturing a vertical power MOSFET, comprising:

(a) providing a silicon wafer having an N+ bottom layer, an N type middle layer, and a P body top layer having an upper surface;

(b) on said P body top layer, forming a layer of pad oxide and depositing thereon a layer of silicon nitride;

(c) patterning the silicon nitride and pad oxide layers to form a mask that defines a trench, having a floor and sidewalls, and then etching said trench to a depth sufficient to extend into said N type middle layer;

(d) forming a first layer of silicon oxide on said floor and sidewalls;

(e) overfilling the trench with polysilicon and then etching back the polysilicon until said polysilicon under-fills the trench;

(f) removing from the sidewalls all exposed silicon oxide;

(g) forming a second layer of silicon oxide on the polysilicon exposed sidewalls, whereby all polysilicon in the trench is now encapsulated in a layer of silicon oxide;

(h) through ion implantation by an ion beam, forming an N+ source area, part of which overlaps and abuts said polysilicon encapsulating oxide layer then removing said layer of silicon nitride;

(i) depositing a conformal layer of a dielectric material and then selectively removing all dielectric material on horizontal surfaces whereby insulating spacers on the walls of the trench are formed;

(j) implanting acceptor ions to form a P+ region that abuts said N+ source area; and (k) forming a silicide contact to the polysilicon and a single silide contact to both the N+ source area and to said P+ region that is abutted thereto.

2. The process described in claim 1 wherein said ion beam is directed at the silicon wafer at an angle, relative to the vertical, of between about 30 and 60 degrees while the wafer rotates relative to the beam.

3. The process described in claim 1 wherein the ion beam is arsenic ions having an energy between about 30 and 80 kilovolts, said ions being deposited to achieve a concentration between about $5 \times 10^{19}$ and $5 \times 10^{20}$ ions per cc.

4. The process described in claim 1 wherein step (e) is replaced as follows:

(e) overfilling the trench with polysilicon, then planarizing the wafer until there is no polysilicon outside the trench, and then removing an amount of polysilicon from the trench by means of reactive ion etching or chemical etching.

5. The process described in claim 1 wherein the dielectric material is selected from the group consisting of silicon oxide and silicon nitride.

6. The process described in claim 1 wherein the insulating spacers extend upwards from the polysilicon as far the upper surface of the wafer.

7. The process described in claim 1 wherein the insulating spacers extend upwards from the polysilicon as far as between about 0.1 and 0.3 microns below the upper surface of the wafer.

8. The process described in claim 1 wherein said silicide contact is selected from the group consisting of titanium silicide, cobalt silicide, and nickel silicide.

9. The process described in claim 1 further comprising adding a punch through implantation after step (i) and before step (j)thereby enabling source to source spacing to be reduced.

10. A process for manufacturing a vertical power MOSFET, comprising:

(a) providing a silicon wafer having an N+ bottom layer, an N type middle layer, and a P body top layer having an upper surface;

(b) on said P body top layer, forming a layer of pad oxide and depositing thereon a layer of silicon nitride;

(c) patterning the silicon nitride and pad oxide layers to form a mask that defines a trench, having a floor and sidewalls, and then etching said trench to a depth sufficient to extend into said N type middle layer;

(d) forming a layer of silicon oxide on said floor and sidewalls;

(e) overfilling the trench with polysilicon and then etching back the polysilicon until said polysilicon under-fills the trench;

(f) removing from the sidewalls all exposed silicon oxide;

(g) through diffusion from a diffusion source, forming an N+ source area, that extends outwards from the sidewalls above the polysilicon into the P body layer;

(h) removing from the sidewalls any byproducts of the diffusion performed in step (g) and then removing the layer of silicon nitride;

(i) depositing a conformal layer of a dielectric material and then selectively removing all dielectric material on horizontal surfaces whereby insulating spacers on the walls of the trench are formed;

(j) implanting acceptor ions to form P+ region that abuts said N+ source area; and (k) forming a silicide contact to the polysilicon and a single silicide contact to both the N+ source area and to said P+ region that is abutted thereto.

11. The process described in claim 10 wherein said diffusion source is phosphorus oxychloride gas.

12. The process described in claim 10 wherein said diffusion source is a layer of glass selected from the group consisting of phosphosilicate glass and arsenosilicate glass.

13. The process described in claim 10 wherein step (e) is replaced as follows:

(e) overfilling the trench with polysilicon, then planarizing the wafer until there is no polysilicon outside the trench, and then removing an amount of polysilicon from the trench by means of reactive ion etching or chemical etching.

14. The process described in claim 10 wherein the dielectric material is selected from the group consisting of silicon oxide and silicon nitride.

15. The process described in claim 10 wherein the insulating spacers extend upwards from the polysilicon as far the upper surface of the wafer.

16. The process described in claim 10 wherein the insulating spacers extend upwards from the polysilicon as far as between about 0.1 and 0.3 microns below the upper surface of the wafer.

17. The process described in claim 10 wherein said silicide contact is selected from the group consisting of titanium silicide, cobalt silicide, and nickel silicide.

18. The process described in claim 10 further comprising adding a punch through implantation after step (i) and before step (j) thereby enabling source to source spacing to be reduced.

* * * * *